United States Patent [19]
Chen et al.

[11] Patent Number: 6,139,697
[45] Date of Patent: *Oct. 31, 2000

[54] LOW TEMPERATURE INTEGRATED VIA AND TRENCH FILL PROCESS AND APPARATUS

[75] Inventors: Liang-Yuh Chen, San Jose; Roderick Craig Mosely, Pleasanton; Fusen Chen, Cupertino; Rong Tao, San Jose; Ted Guo, Palo Alto, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/792,292

[22] Filed: Jan. 31, 1997

[51] Int. Cl.[7] .................................................. C23C 14/34
[52] U.S. Cl. .............................. 204/192.15; 204/192.17; 427/250; 427/252; 427/566; 427/584
[58] Field of Search ..................... 204/192.12, 192.15, 204/192.17, 192.22, 192.23, 192.25; 427/250, 252, 566, 584

[56] References Cited

U.S. PATENT DOCUMENTS

| | | | |
|---|---|---|---|
| 4,784,973 | 11/1988 | Stevens et al. | 437/200 |
| 4,920,072 | 4/1990 | Keller et al. | 437/192 |
| 4,920,073 | 4/1990 | Wei et al. | 437/200 |

(List continued on next page.)

FOREIGN PATENT DOCUMENTS

| | | | |
|---|---|---|---|
| 0351001A1 | 1/1990 | European Pat. Off. | H01L 21/320 |
| 0448763A1 | 10/1991 | European Pat. Off. | H01L 21/285 |
| 0499050A1 | 8/1992 | European Pat. Off. | H01L 21/90 |
| 98300539 | 1/1998 | European Pat. Off. . | |
| 98300539 | 7/1998 | European Pat. Off. . | |
| 8-10693 | 1/1986 | Japan | H01L 21/88 |
| 63-9925 | 1/1988 | Japan | H01L 21/28 |
| 2-26051 | 1/1990 | Japan | H01L 21/90 |
| 03289156 | 12/1991 | Japan | H01L 21/90 |
| 07176612 | 7/1995 | Japan . | |
| 2513900 | 4/1996 | Japan | H01L 21/285 |

OTHER PUBLICATIONS

"CVD Aluminum for Submicron VLSI Metallization", Lai, W. Y–C., et al. Jun. 11–12, 1991.

IBM Technical Disclosure Bulletin, vol. 37, No. 10, Oct., 1994.

Nobuyoshi Awaya, Hiroshi Inokawa, Eiichi Yamamoto, Yukio Okazaki, Masayasu Miyake, Yoshinobu Arita, and Toshio Kobayashi, "Evaluation of a Copper Metallization Process and the Electrical Characteristics of Copper–Interconnected Quarter–Micron CMOS", vol. 43, No. 8, Aug., 1996, pp. 1206–1211.

(List continued on next page.)

*Primary Examiner*—Nam Nguyen
*Assistant Examiner*—Steven H. VerSteeg
*Attorney, Agent, or Firm*—Thomason, Moser & Patterson

[57] ABSTRACT

The present invention relates generally to an improved process for providing complete via fill on a substrate and planarization of metal layers to form continuous, void-free contacts or vias in sub-half micron applications. In one aspect of the invention, a refractory layer is deposited onto a substrate having high aspect ratio contacts or vias formed thereon. A CVD metal layer, such as CVD Al or CVD Cu, is then deposited onto the refractory layer at low temperatures to provide a conformal wetting layer for a PVD Cu. Next, a PVD Cu is deposited onto the previously formed CVD Cu layer at a temperature below that of the melting point temperature of the metal. The resulting CVD/PVD Cu layer is substantially void-free. The metallization process is preferably carried out in an integrated processing system that includes both a PVD and CVD processing chamber so that once the substrate is introduced into a vacuum environment, the metallization of the vias and contacts occurs without the formation of an oxide layer over the CVD Cu layer. The via fill process of the present invention is also successful with air-exposure between the CVD Cu and PVD Cu steps.

18 Claims, 6 Drawing Sheets

U.S. PATENT DOCUMENTS

| | | | |
|---|---|---|---|
| 4,926,237 | 5/1990 | Sun et al. | 357/71 |
| 4,938,996 | 7/1990 | Ziv et al. | 427/53.1 |
| 4,951,601 | 8/1990 | Maydan et al. | 118/719 |
| 4,960,732 | 10/1990 | Dixit et al. | 437/192 |
| 4,985,750 | 1/1991 | Hoshino | 357/71 |
| 4,994,410 | 2/1991 | Sun et al. | 437/192 |
| 5,010,032 | 4/1991 | Tang et al. | 437/57 |
| 5,023,201 | 6/1991 | Stanasolovich et al. | 437/192 |
| 5,028,565 | 7/1991 | Chang et al. | 437/192 |
| 5,043,299 | 8/1991 | Chang et al. | 437/192 |
| 5,043,300 | 8/1991 | Nulman | 437/200 |
| 5,081,064 | 1/1992 | Inoue et al. | 437/190 |
| 5,091,339 | 2/1992 | Carey | 437/187 |
| 5,102,826 | 4/1992 | Ohshima et al. | 437/200 |
| 5,102,827 | 4/1992 | Chen et al. | 437/200 |
| 5,106,781 | 4/1992 | De Vries | 437/192 |
| 5,143,867 | 9/1992 | d'Heurle et al. | 437/188 |
| 5,147,819 | 9/1992 | Yu et al. | 437/173 |
| 5,250,465 | 10/1993 | Iizuka et al. | 437/173 |
| 5,250,467 | 10/1993 | Somekh et al. | 437/192 |
| 5,292,558 | 3/1994 | Heller et al. | 427/533 |
| 5,354,712 | 10/1994 | Ho et al. | 437/195 |
| 5,380,682 | 1/1995 | Edwards et al. | 437/225 |
| 5,439,731 | 8/1995 | Li et al. | 428/209 |
| 5,478,780 | 12/1995 | Koerner et al. | 437/190 |
| 5,480,836 | 1/1996 | Harada et al. | 437/192 |
| 5,514,425 | 5/1996 | Ito et al. | 427/534 |
| 5,585,673 | 12/1996 | Joshi et al. | 257/751 |
| 5,607,776 | 3/1997 | Mueller et al. | 428/472 |

OTHER PUBLICATIONS

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," 1996 IEEE, pp. 365–368.

Aluminum Chemical Vapor Deposition with New Gas Phase Pretreatment Using Tetrakisdimethylamino–Titanium for Ultralarge–Scale Integrated Circuit, K. Sugai, H. Okabayashi, T. Shinzawa, S. Kishida, A. Kobayashi, T. Yako, and H. Kadokura, Jun. 16, 1995, (pp. 2115–2118).

Formation of Titanium Nitride Layers by the Nitradation of Titanium in High–Pressure Ammonium Ambient, Tohru Hara, Kouichi Tani, and Ken Inoue, Applied Physics Letters 57, Oct. 15, 1990, No. 16, New York.

Self–Aligned Titanium Silicidation by Lamp Annealing, K. Tsukamoto et al., Japanese Journal of Applied Physics Supplements, 16th Int. Conf. Solid State Devices and Materials, (1984) Koi Aug. 30–Sep. 1, Tokyo Japan, (4) pages.

Copper Metallization for ULSI and Beyond, Shyam P. Mararka and Steven W. Hymes, Critical Reviews in Solid State and Materials Sciences, 20(2):87–120 (1995).

LOW TEMPERATURE INTEGRATED VIA AND TRENCH FILL PROCESS AND APPARATUS

FIELD OF THE INVENTION

The present invention relates to a metallization process for manufacturing semiconductor devices. More particularly, the present invention relates to the metallization of apertures to form void-free interconnections between conducting layers, including such contacts or vias in high aspect ratio sub-half micron applications.

BACKGROUND OF THE RELATED ART

Sub-half micron multilevel metallization is one of the key technologies for the next generation of very large scale integration ("VLSI"). The multilevel interconnections that lie at the heart of this technology require planarization of high aspect ratio apertures, including contacts, vias, lines or other features. Reliable formation of these interconnects is very important to the success of VLSI and to the continued effort to increase circuit density and quality on individual substrates and die.

Aluminum (Al) or copper (Cu) layers formed by chemical vapor deposition ("CVD"), like other CVD processes, provide good conformal layers, i.e., a uniform thickness layer on the sides and base of the feature, for very small geometries, including sub-half micron (<0.5 $\mu$m) apertures, at low temperatures. Therefore, CVD processes (CVD Al or CVD Cu) are common methods used to fill apertures. However, recent transmission electron microscopy data ("TEM") has revealed that voids exist in many of the CVD formed Al apertures even though electric tests of these same apertures do not evidence the existence of this void. If the layer is subsequently processed, the void can result in a defective circuit. It should be recognized that this kind of void is very difficult to detect by regular cross sectional standard electron microscopy ("SEM") techniques, because some deformation occurs in soft aluminum during mechanical polishing. In addition, electric conductivity tests do not detect any structural abnormalities. However, despite generally positive electric conductivity tests, conduction through the contact having the void may, over time, compromise the integrity of the integrated circuit devices.

A TEM study of various CVD Al layers formed on substrates indicates that the formation of voids occurs through a key hole process wherein the top portion of the via becomes sealed before the via has been entirely filled. Although a thin conformal layer of CVD Al can typically be deposited in high aspect ratio contacts and vias at low temperatures, continued CVD deposition to complete filing of the contacts or vias typically results in the formation of voids therein. Extensive efforts have been focused on elimination of voids in metal layers by modifying CVD processing conditions. However, the results have not yielded a void free structure.

An alternative technique for metallization of high aspect ratio apertures, is hot planarization of aluminum through physical vapor deposition ("PVD"). The first step in this process requires deposition of a thin layer of a refractory metal such as titanium (Ti) on a patterned wafer to form a wetting layer which facilitates flow of the Al during the PVD process. Following deposition of the wetting layer, the next step requires deposition of either (1) a hot PVD Al layer or (2) a cold PVD Al layer followed by a hot PVD Al layer onto the wetting layer. However, hot PVD Al processes are very sensitive to the quality of the wetting layer, wafer condition, and other processing parameters. Small variations in processing conditions and/or poor coverage of the wetting layer can result in incomplete filling of the contacts or vias, thus creating voids. In order to reliably fill the vias and contacts, hot PVD Al processes must be performed at temperatures above about 450° C. Because a PVD Ti wetting layer provides poor coverage of high aspect ratio, sub-micron via side walls, hot PVD Al does not provide reliable filling of the contacts or vias. Even at higher temperatures, PVD processes may result in a bridging effect whereby the mouth of the contact or via is closed because the deposition layer formed on the top surface of the substrate and the upper walls of the contact or via join before the floor of the contact or via has been completely filled.

Once a PVD Al layer has been deposited onto the substrate, reflow of the Al may occur by directing ion bombardment towards the substrate itself. Bombarding the substrate with ions causes the metal layer formed on the substrate to reflow. This process typically heats the metal layer as a result of the energy created by the plasma and resulting collisions of ions onto the metal layer. The high temperatures generated in the metal layers formed on the substrate compromises the integrity of devices having sub-half micron geometries. Therefore, heating of the metal layers is disfavored in these applications.

U.S. Pat. No. 5,147,819 ("the '819 patent") discloses a process for filling vias that involves applying a CVD Al layer with a thickness of from 5 percent to 35 percent of the defined contact or via diameter to improve step coverage, then applying a sufficiently thick PVD Al layer to achieve a predetermined overall layer thickness. A high energy laser beam is then used to melt the intermixed CVD Al and PVD Al and thereby achieve improved step coverage and planarization. However, this process requires heating the wafer surface to a temperature no less than 660° C. Such a high temperature is not acceptable for most sub-half micron technology. Furthermore, the use of laser beams scanned over a wafer may affect the reflectivity and uniformity of the metal layer.

The '819 patent also discloses that silicide layers and/or barrier metal layers may be deposited onto a wafer before Al is deposited by either a CVD or PVD process. According to the teachings of this reference, these additional underlying layers are desirable to increase electrical conduction and minimize junction spiking.

U.S. Pat. No. 5,250,465 ("the '465 patent") discloses a process similar to the '819 patent using a high energy laser beam to planarize intermixed CVD/PVD Al structures. Alternatively, the '465 patent teaches the application of a PVD Al layer formed at a wafer temperature of about 550° C. However, during the high temperature sputtering process, ion bombardment due to the plasma raises the surface temperature to about 660° C. causing the Al film to melt and planarize. Like the process of the '819 patent, the use of high temperatures is unacceptable for most sub-half micron applications, and particularly for use in filling high aspect ratio sub-half micron contacts and vias. Subjecting wafers to temperatures high enough to melt intermixed CVD/PVD Al layers can compromise the integrity of devices formed on the substrate, in particular where the process is used to planarize a metal layer formed above several other metal and dielectric layers.

Other attempts at filling high aspect ratio sub-half micron contacts and vias using known reflow or planarization processes at lower temperatures have resulted in dewetting of the CVD Al from the silicon dioxide ($SiO_2$) substrate and the formation of discontinuous islands on the side walls of the vias. Furthermore, in order for the CVD Al to resist dewetting at lower temperatures, the thickness of the CVD Al has to be several thousand Angstroms (A). Since ten thousand Angstroms equal one micron, a CVD Al layer of several thousand Angstroms on the walls of a sub-half micron via will completely seal the via and form voids therein.

Metal features formed in a semiconductor device, such as plugs and lines formed in vias and to trenches, are typically made with aluminum or aluminum dopped with copper. However, the performance of there aluminum features is not only limited by the deposition process, but also by the very nature of aluminum metal. Copper, on the other hand, is a generally preferred conductor since it provides lower resistivity and better electromigration resistance than aluminum.

Therefore, there remains a need for a low temperature metallization process for filling apertures, particularly high aspect ratio sub-half micron contacts and vias, with copper. More particularly, it would be desirable to have a low temperature process for filling such contacts and vias with a thin layer of CVD copper (Cu) and allowing the via to then be filled with PVD Cu.

SUMMARY OF THE INVENTION

The present invention provides a process for providing uniform step coverage on a substrate. First, a thin refractory layer is formed on a substrate followed by a thin conformal CVD Cu layer formed over the refractory layer. A PVD Cu layer is then deposited over the CVD Cu layer.

The present invention relates generally to improved step coverage and planarization of metal layers to form continuous, void-free contacts or vias, such as in sub-half micron applications. In one aspect of the invention, a refractory layer is deposited onto a substrate having high aspect ratio contacts or vias formed thereon. A CVD Cu layer is then deposited onto the refractory layer at low temperatures to provide a conformal wetting layer for PVD Cu. Next, PVD Cu is deposited onto the previously formed CVD wetting layer at a temperature below that of the melting point of copper. The resulting CVD Cu/PVD Cu layer is substantially void-free.

In another aspect of the invention, the metallization process is carried out in an integrated processing system that includes both a PVD and CVD processing chamber. Once the substrate is introduced into a vacuum environment, the metallization of the vias and contacts occurs without the formation of an oxide layer over the CVD layer. This results because the substrate need not be transferred from one processing system to another system to undergo deposition of the CVD and PVD deposited layers. Accordingly, the substrate remains under vacuum pressure thereby preventing formation of detrimental oxide layers. Furthermore, diffusion of dopants between the PVD and CVD layers is improved by sequential deposition in the integrated system.

The present invention further provides an apparatus for providing improved step coverage and metallization of a semiconductor. The apparatus comprises a multiplicity of isolatable communicating regions including a load lock chamber, a refractory metal processing chamber, a CVD Cu processing chamber, and a PVD Cu processing chamber. The apparatus further comprises an intermediate substrate transport region and vacuum means communicating with the isolatable regions for establishing a vacuum gradient of decreasing pressure across the apparatus from the load lock chamber to the processing chambers.

In one embodiment, the present invention comprises a method of forming a feature on a substrate, comprising sputtering a barrier/wetting layer, which may have a thickness of between about 100 and about 200 Angstroms, over the surfaces of an aperture, the barrier/wetting layer having a thickness of between about 5 and about 700 Angstroms, chemical vapor depositing copper over the surface of the barrier/wetting layer without capping the aperture, the chemical vapor deposited copper having a thickness between about 200 Angstroms and about 1 micron, physical vapor depositing copper over the chemical vapor deposited copper at a temperature below about 660° C. and perhaps below about 400° C. to cause the CVD and PVD copper to flow into the aperture without voids forming therein. At least part of the process may be performed in a common vacuum mainframe, although separate chambers may also be used. The substrate may be exposed to oxygen between the chemical vapor deposition and the physical vapor deposition stages. Additionally, the physical vapor deposited copper may comprise a dopant, such as tin, and the method may further comprise annealing at a temperature of between about 250° C. and about 450° C.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The present invention provides a method for providing improved via fill in high aspect ratio apertures at low temperature, particularly in sub-micron apertures. One aspect of the invention provides a method for metallizing high aspect ratio apertures, including contacts, vias, lines or other features, at temperatures below about 660° C. In particular, the invention provides improved step coverage for filling high aspect ratio apertures in applications with a first layer of a CVD copper ("CVD Cu"), and a second layer of PVD copper ("PVD Cu") where the thin CVD Cu layer is prevented from dewetting on a dielectric layer by capping the dielectric layer with a thin barrier/wetting layer comprised of a refractory metal and/or conductive metal having a melting point greater than that of the CVD Cu and providing greater wetting with the CVD Cu than does the dielectric. A barrier layer, such as tantalum (Ta), is necessary to prevent the diffusion of copper into the adjacent dielectric material which can cause electrical shorts to occur. If the barrier material itself does not provide sufficient wetting of copper, then a separate wetting layer may be deposited over the barrier layer prior to copper deposition. Preferably, this process occurs in an integrated processing system including both a CVD and a PVD processing chamber. However, the barrier/CVD Cu/PVD Cu sequence provides the advantage of being resistant to oxidation and may, therefore, be exposed to air between steps without the formation of oxides which increase the electrical resistance.

It has been demonstrated that some metals, such as aluminum (Al) and copper (Cu), can flow at temperatures below their respective melting points due to the effects of surface tension. However, these metals have a tendency to dewet from an underlying dielectric layer at high temperatures. Therefore, the present invention interposes a barrier/wetting layer between a metal layer and the dielectric to improve the wetting of the metal. An appropriate barrier/wetting layer is one that wets the metal better than the dielectric material. It is preferred that the barrier/wetting layer provide improved wetting even when only a thin barrier/wetting layer is deposited. It follows that a preferred barrier/wetting layer is formed substantially uniformly over the surface of the dielectric, including the walls and floor of the apertures.

According to the present invention, preferred barrier/wetting layers include such layers as a refractory (tungsten (W), niobium (Nb), aluminum silicates, etc.), tantalum (Ta), tantalum nitride (TaN), titanium nitride (TiN), PVD Ti/N$_2$- stuffed, a ternary compound (such as TiSiN, WSiN, etc.) or a combination of these layers and generally have a thickness of less than about 2000 Å. The most preferred barrier/wetting materials are Ta and TaN which typically are provided as a PVD layer having a thickness between about 800 and about 1000 Å. Conversely, a CVD TiN barrier/wetting layer will typically have a thickness between about 100 and about 400 Å. The barrier/wetting layer is deposited to form a substantially continuous cap over the dielectric layer and may be treated with nitrogen. Alternatively, exposed surfaces of silicon can be treated with nitrogen to form a $Si_xN_y$ layer than is effective as a barrier layer for copper.

A CVD Cu wetting layer may be deposited at temperatures below about 660° C. and preferably below about 400° C. using by any known CVD Cu process or precursor gas, including copper$^{+2}$(hfac)$_2$ and Cu$^{+2}$(fod)$_2$ (fod being an abbreviation for heptafluoro dimethyl octanediene), but a preferred process uses the volatile liquid complex copper$^{+1}$hfac, TMVS (hfac being an abbreviation for the hexafluoro acetylacetonate anion and TMVS being an abbreviation for trimethylvinylsilane) with argon as the carrier gas. Because this complex is a liquid under ambient conditions, it can be utilized in standard CVD bubbler precursor delivery systems currently used in semiconductor fabrication. Both TMVS and copper$^{+2}$(hfac)$_2$ are volatile byproducts of the deposition reaction that are exhausted from the chamber. The deposition reaction is believed to proceed according to the following mechanism, in which (s) denoted interaction with a surface and (g) denotes the gas phase.

$$2Cu^{+1}hfac,TMVS(g) \rightarrow 2Cu^{+1}hfac,TMVS(s) \quad \text{step (1)}$$

$$2Cu^{+1}hfac,TMVS(s) \rightarrow 2Cu^{+1}hfac(s)+2TMVS(g) \quad \text{step (2)}$$

$$2Cu^{+1}hfac(s) \rightarrow Cu(s)+Cu^{+2}(hfac)_2(g) \quad \text{step (3)}$$

In step 1, the complex is adsorbed from the gas phase onto a metallic surface. In step 2, the coordinated olefin (TMVS in this specific case) dissociates from the complex as a free gas leaving behind Cu$^{+2}$hfac as an unstable compound. In step 3, the Cu$^{+1}$hfac disproportionates to yield copper metal and volatile Cu$^{+2}$(hfac)$_2$. The disproportionation at CVD temperatures appears to be most strongly catalyzed by metallic or electrically conducting surfaces. In an alternative reaction, the organometallic copper complex can be reduced by hydrogen to yield metallic copper.

The volatile liquid complex, Cu$^{+1}$hfac,TMVS, can be used to deposit Cu through either a thermal or plasma based process, with the thermal based process being most preferred. The substrate temperature for the plasma enhanced process is preferably between about 100 and about 400° C., while that for the thermal process is between about 50 and about 300° C., most preferably about 170° C. Following either of these processes, a CVD Cu wetting layer may be provided over a nucleation layer. Alternatively, electroplated copper may be used in combination with or in replacement of the CVD Cu wetting layer.

Following deposition of a CVD Cu wetting layer, the substrate is then sent to a PVD Cu chamber to deposit PVD Cu below the melting point temperature of the CVD Cu and PVD Cu. Where the soft metal is copper, it is preferred that the PVD Cu be deposited at a wafer temperature below about 550° C., preferably below about 400° C. The copper layers start to flow during the PVD deposition process at above 200° C., with the tantalum barrier/wetting layer remaining firmly in place as a solid metal layer. Because tantalum has good wetting with copper, the CVD Cu is prevented from dewetting the tantalum at about 400° C. and, therefore, wafer temperatures above the melting point of aluminum (>660° C.), as taught by the prior art CVD process, are not required. Therefore, the application of a thin tantalum layer enables planarization of the copper to be achieved at temperatures far below the melting point of the copper.

While not generally preferred, the present invention may include processes that combine CVD Al/PVD Cu or CVD Cu/PVD Al. It should be recognized that these combinations are limited by the electrical resistances provided by the resulting intermetallic compound. Consequently, in a CVD Al/PVD Cu process, the CVD Al should not comprise greater than about one percent of the metal volume. Similarly, in a CVDCu/PVD Al process, the CVD Cu should not comprise greater than about one percent of the metal volume. When the PVD metal sequentially follows the CVD metal in an integrated process, no oxide layer can form therebetween and the PVD metal grows epitaxially on the CVD metal such that no grain boundaries are present. Furthermore, where the Al and Cu are combined, the intermetallic layer should be annealed between about 250° C. to about 450° C. and preferably at about 300° C. for about 15 minutes to achieve a uniform distribution of the dopant metal in the stack. It is also preferred that the top surface of the stack receive a PVD TiN anti-reflection coating ("ARC") for reducing the reflectivity of the surface and improving the photolithographic performance of the layer. Finally, a most preferred method of the present invention for metallization of a substrate aperture includes the sequential steps of precleaning the substrate surface, depositing tantalum through an IMP or collimated PVD process, CVD Cu, PVD Cu, and, optionally, metal etch (TiN ARC) or chemical mechanical polishing (CMP)(such as a Mirror System available from Applied Materials, Santa Clara, Calif.).

When CVD Al is desired, it may be deposited under various conditions, but a standard process involves wafer temperatures of between about 180° C. and about 265° C. and a deposition rate of between about 20 Å/sec and about 130 Å/sec. The CVD Al deposition may be performed at chamber pressures of between about 1 torr and about 80 torr, with the preferred chamber pressures being about 25 torr. The preferred deposition reaction for CVD Al involves the reaction of dimethyl aluminum hydride ("DMAH") with hydrogen gas ($H_2$) according to the following equation:

$$(CH_3)_2Al-H+H_2 \rightarrow Al+CH_4+H_2$$

Figure 1:
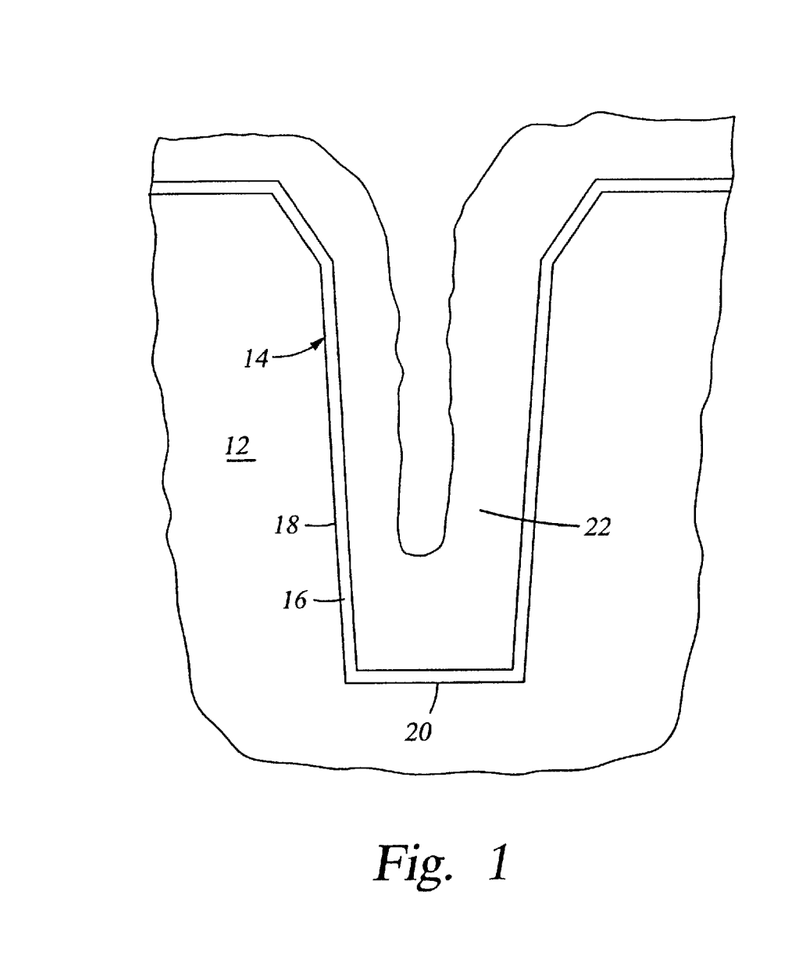
FIG. 1 is a schematic diagram of a metallized semiconductor substrate via according to the present invention having a glue layer and a CVD wetting layer.

Referring now to FIG. 1, a schematic diagram of a substrate having a patterned dielectric layer 12 formed thereon is shown. The dielectric layer 12 has a via 14 having a high aspect ratio, i.e, a high ratio of via depth to via diameter, of about three (3), but the present invention may be beneficial in cooperation with vias having any aspect ratio. A thin tantalum layer 16 is deposited directly onto the substrate covering substantially all surfaces of the dielectric layer 12 including the walls 18 and floor 20 of via 14. The thin tantalum layer 16 will generally have a thickness of between about 5 Å and about 700 Å, with the preferred thickness being in the range between about 100 Å and about 200 Å. A conformal CVD Cu layer 22 is deposited on the tantalum layer 16 to a desired thickness not to exceed the thickness which would seal the top of the contact or via and generally may be from about 200 Å to about 1 micron and preferably less than about 5000 Å.

Figure 2:
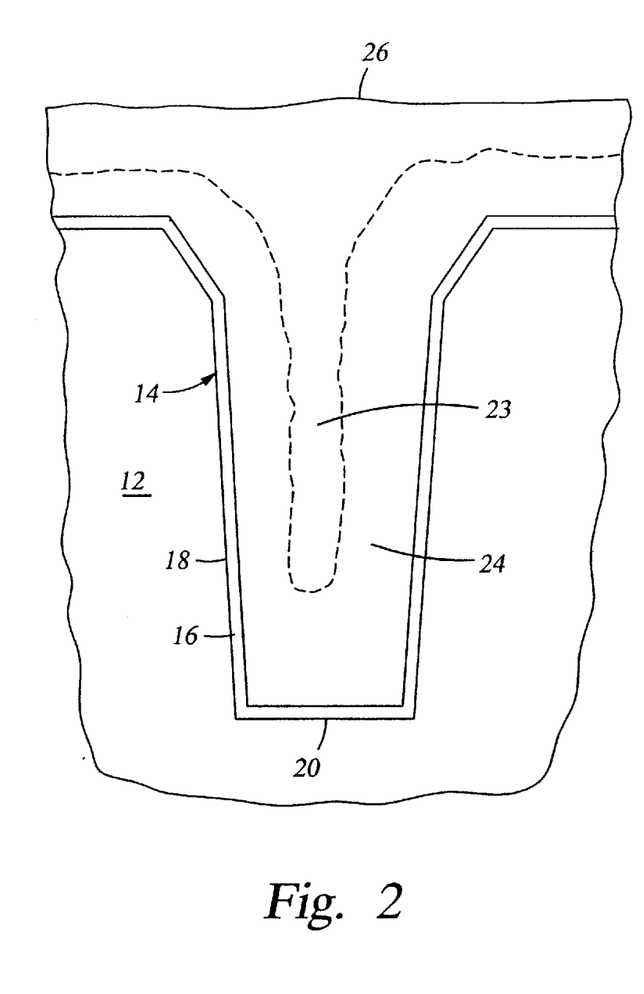
FIG. 2 is a schematic diagram of a metallized semiconductor substrate via according to the present invention having a glue layer and an intermixed CVD Cu/PVD Cu layer.

Referring now to FIG. 2, a PVD Cu layer 23 is deposited onto the CVD Cu layer 22 (layer 22 of FIG. 1). An integrated CVD Cu/PVD Cu layer 24 will result from integrating the PVD Cu layer 23 that is deposited onto the CVD Cu layer 22. The PVD Cu may contain certain dopants (such as tin (Sn)) and upon deposition the PVD Cu may integrate with the CVD Cu so that the dopant is dispersed throughout much of the CVD Cu/PVD Cu intermetallic layer 24. In general, the PVD Cu does not need to be doped. The top surface 26 of the intermetallic layer 24 is substantially planarized. Because the tantalum layer provides good wetting of the CVD Cu layer, the dielectric layer or wafer temperature during deposition of PVD Cu does not need to exceed the melting point of copper, but rather may be performed at a temperature below about 660° C. and is preferable performed at a temperature below about 400° C.

The apparatus

Figure 3:
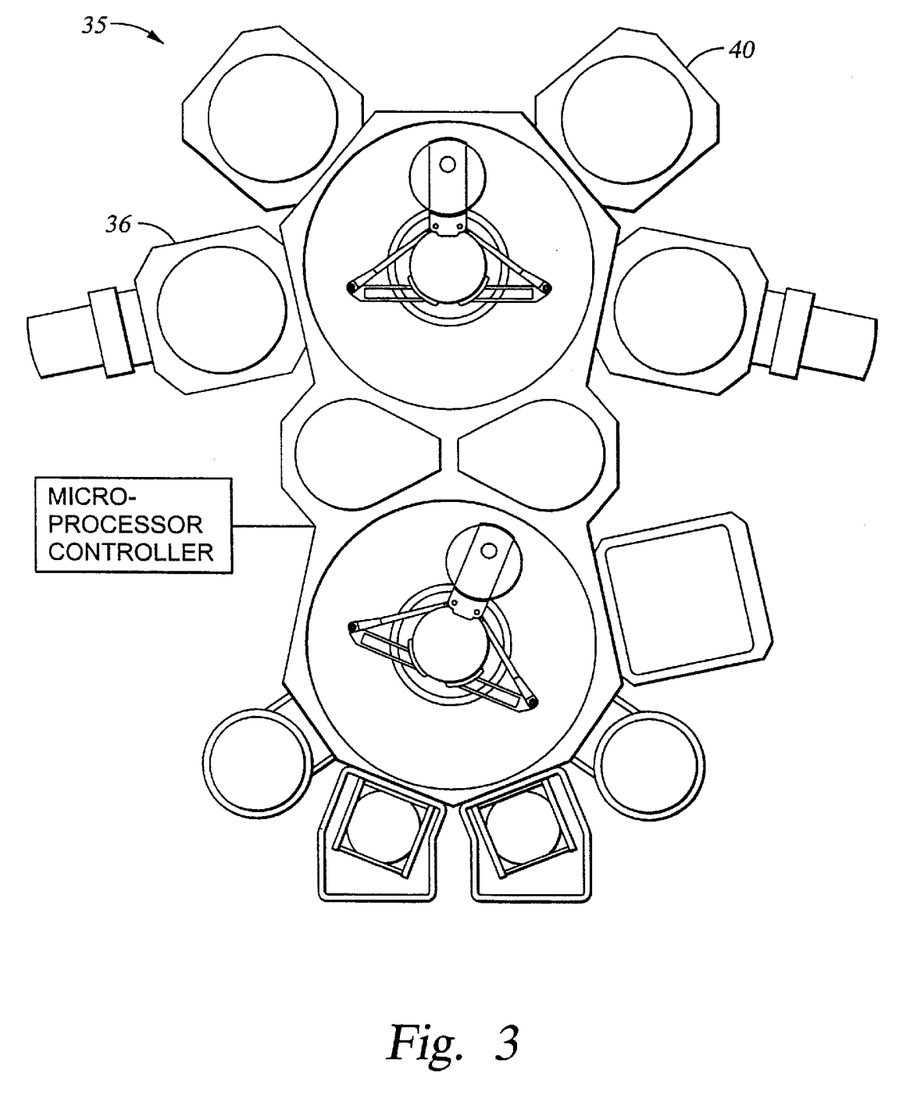
FIG. 3 is a schematic top view of an integrated multi-chamber apparatus suitable for performing CVD and PVD processes on a substrate.

While the processes of the present invention are preferably carried out in a multichamber processing apparatus or cluster tool having both PVD and CVD chambers, the processes may be also be carried out in separate PVD and CVD chamber. A schematic of a multichamber processing apparatus 35 suitable for performing the CVD and PVD processes of the present invention is illustrated in FIG. 3. The apparatus is an "ENDURA" system commercially available from Applied Materials, Inc., Santa Clara, Calif. A similar staged-vacuum wafer processing system is disclosed in U.S. Pat. No. 5,186,718, entitled Staged-Vacuum Wafer Processing System and Method, Tepman et al., issued on Feb. 16, 1993, which is hereby incorporated herein by reference. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers, for example, a CVD chamber 40, a PVD chamber 36 and rapid thermal annealing chambers.

The apparatus 35 includes at least one enclosed PVD deposition chamber 36 for performing PVD processes, such as sputtering. The PVD chamber 36 comprises a sputtering target of sputtering material facing the substrate. The target is electrically isolated from the chamber and serves as a process electrode for generating a sputtering plasma. During the sputtering process, a sputtering gas, such as argon or xenon, is introduced into the chamber 36. An RF bias current is applied to the sputtering target, and the support supporting the substrate in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from about 100 to 10,000 Watts, to the sputtering target.

Figure 4:
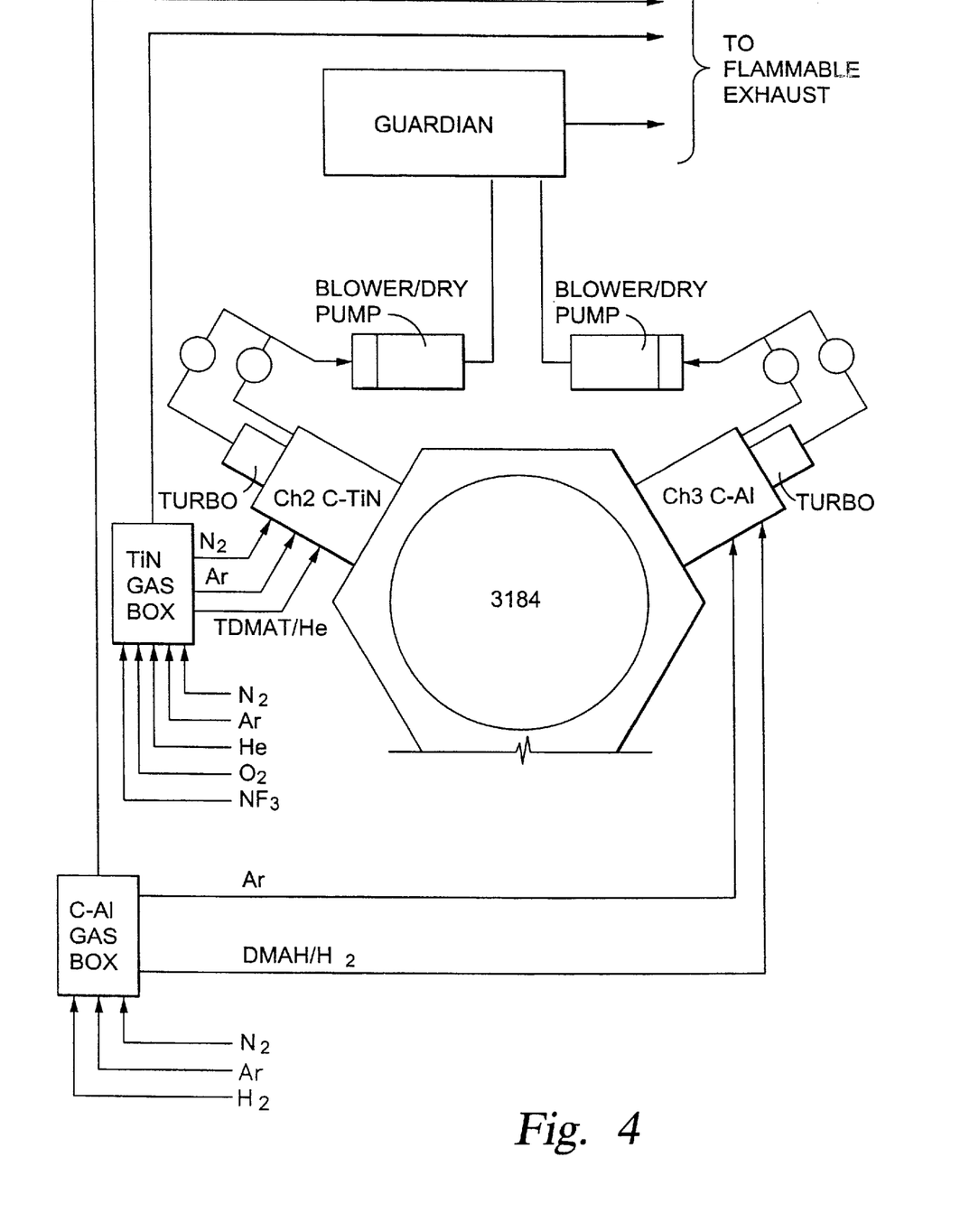
FIG. 4 is a schematic flow diagram of a CVD gas box delivery system for suppling gases to the system of FIG. 3.

FIG. 4 is a schematic diagram of a gas box system for supplying gases to the CVD chamber 40 of the system 35 in FIG. 3 is illustrated. Where CVD TiN is to be used, the gas box is supplied with $N_2$, Ar, He, $O_2$, and $NF_3$. The reactants tetracus dimethyl amino titanium ("TDMAT"), along with the inert gas Ar and $N_2$, are passed into the CVD TiN chamber for processing. Where CVD Al is to be used, a CVD Al gas box is supplied with $N_2$, Ar and $H_2$. The reactants dimethyl aluminum hydride ("DMAH")/$H_2$ and the inert gas Ar are passed into the CVD Al chamber for deposition of aluminum. Similarly, where CVD Cu is to be used, a CVD Cu liquid delivery system (such as an LM or HM mass flow meter combined with an LC or HC flow controller available from Porter Instruments, Inc., Scotts Valley, Calif.) or gas box is supplied with a precursor gas (such as $Cu^{+1}hfac,TMVS$). Each of the CVD chambers are equipped with a turbo pump for providing a vacuum in the chamber and a blower/dry pump.

Figure 5:
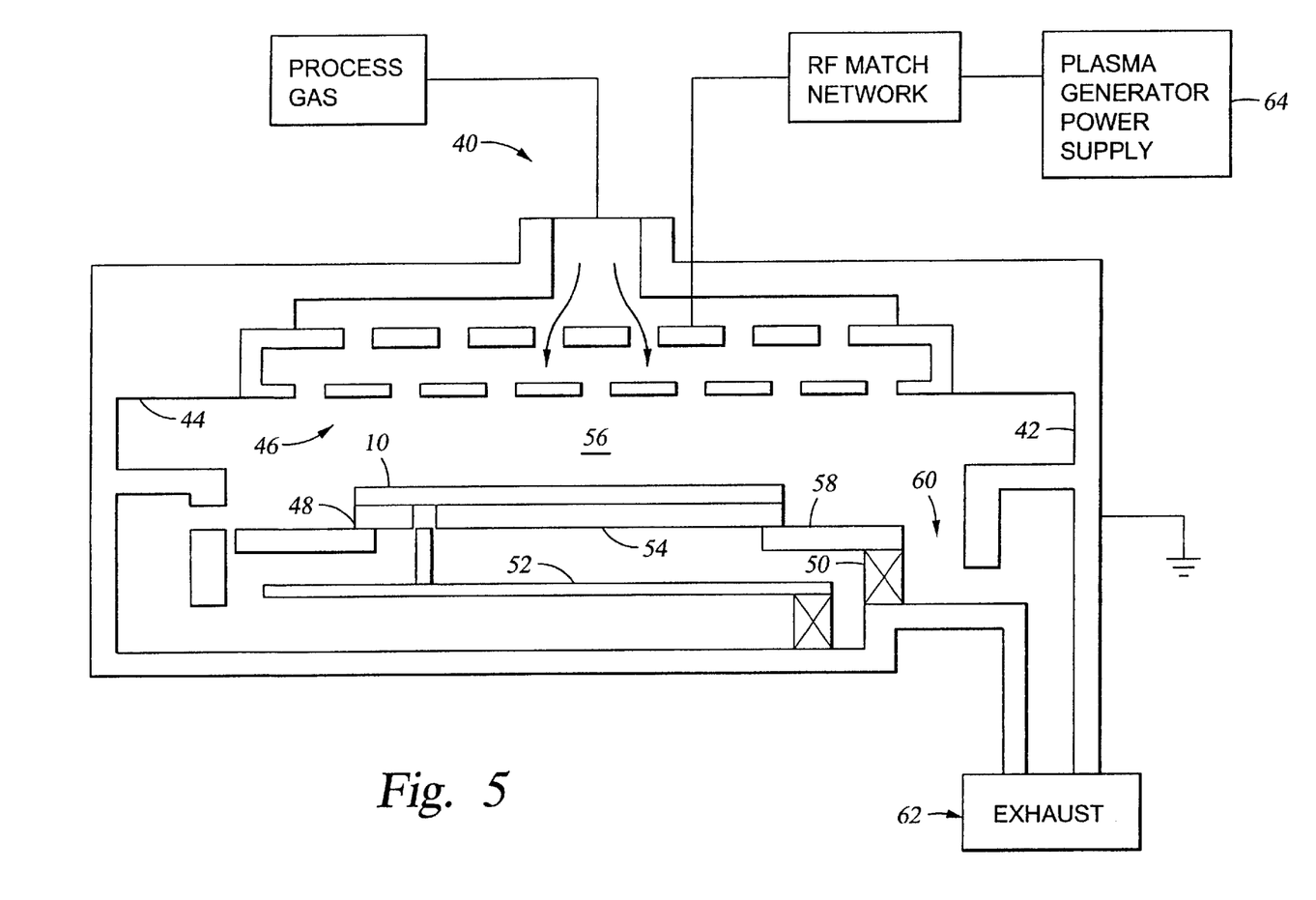
FIG. 5 is a schematic partial sectional view of a CVD chamber suitable for performing the CVD deposition processes of the present invention.

FIG. 5 is a schematic partial sectional view of the CVD deposition chamber 40 suitable for performing the CVD deposition processes of the present invention. The CVD deposition chamber 40 has surrounding sidewalls 42 and a ceiling 44. The chamber 40 comprises a process gas distributor 46 for distributing delivering process gases into the chamber. Mass flow controllers and air operated valves are used to control the flow of process gases into the deposition chamber 40. The gas distributor 46 is typically mounted above the substrate 10 or peripherally about the substrate 10. A support member 48 is provided for supporting the substrate in the deposition chamber 40. The substrate is introduced into the chamber 40 through a substrate loading inlet in the sidewall 42 of the chamber 40 and placed on the support 48. The support 48 can be lifted or lowered by support lift bellows 50 so that the gap between the substrate and gas distributor 46 can be adjusted. A lift finger assembly 52 comprising lift fingers that are inserted through holes in the support 48 can be used to lift and lower the substrate onto the support to facilitate transport of the substrate into and out of the chamber 40. A thermal heater 54 is then provided in the chamber to rapidly heat the substrate. Rapid heating and cooling of the substrate is preferred to increase processing throughput, and to allow rapid cycling between successive processes operated at different temperatures within the same chamber. The temperature of the substrate 10 is generally estimated from the temperature of the support 48.

The substrate is processed in a process zone 56 above a horizontal perforated barrier plate 58. The barrier plate 58 has exhaust holes 60 which are in fluid communication with an exhaust system 62 for exhausting spent process gases from the chamber 40. A typical exhaust system 62 comprises a rotary vane vacuum pump (not shown) capable of achieving a minimum vacuum of about 10 mTorr, and optionally a scrubber system for scrubbing byproduct gases. The pressure in the chamber 40 is sensed at the side of the substrate and is controlled by adjusting a throttle valve in the exhaust system 62.

A plasma generator 64 is provided for generating a plasma in the process zone 56 of the chamber 40 for plasma enhanced chemical vapor deposition processes. The plasma generator 64 can generate a plasma (i) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF current at a power level of from about 750 Watts to about 2000 Watts can be applied to an inductor coil (not shown) to inductively couple energy into the deposition chamber to generate a plasma in the process zone 56. When an RF current is used, the frequency of the RF current is typically from about 400 KHZ to about 16 MHZ, and more typically about 13.56 MHZ. Optionally, a gas containment or plasma focus ring (not shown), typically made of aluminum oxide or quartz, can be used to contain the flow of process gas or plasma around the substrate.

Figure 6:
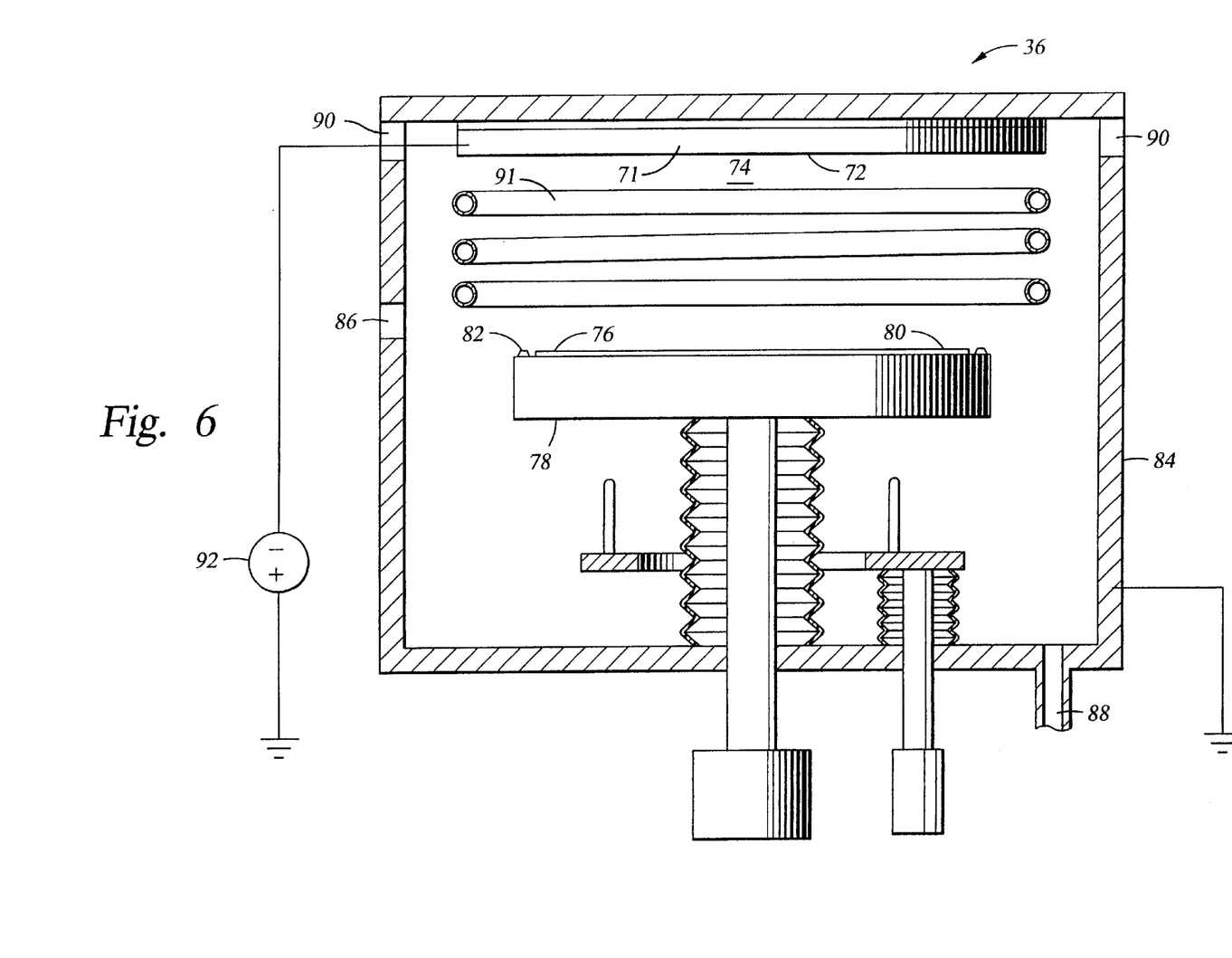
FIG. 6 is a schematic cross-sectional view of a PVD chamber suitable for performing a PVD processes of the present invention.

FIG. 6 is a schematic cross-sectional view of the PVD chamber 36 suitable for performing a PVD processes of the present invention. The PVD chamber target 71 provides a sputtering surface 72 positioned in a conventional vacuum chamber 74, wherein a workpiece 76 is received in the chamber 74 and positioned on a support member, such as a pedestal 78, for depositing a layer of sputtered material on the top surface 80 of the workpiece 76. The pedestal 78 includes a generally planar surface 82 for receiving the workpiece 76 thereon, so that the top surface 80 of the workpiece 76 is generally parallel to the planar surface 82 of the pedestal 78. The material layer may, if desired, be formed over one or more dielectric, metal or other layers previously formed on the workpiece 76, and may fill holes in the dielectric or other layer to form a via, line or contact.

The conventional vacuum chamber 74 generally includes a chamber enclosure wall 84, having at least one gas inlet 86 and an exhaust outlet 88 connected to an exhaust pump (not shown). The workpiece support pedestal 78 is typically disposed through the lower end of the chamber 74, and the target 71 is typically received at the upper end of the chamber 74. The target 71 is electrically isolated from the enclosure wall 84 by an insulating member 90 and the enclosure wall 84 is preferably grounded, so that a negative voltage may be maintained on the target 71 with respect to the grounded enclosure wall 84. It is preferred that the chamber 74 further include an inductive coil 91 coupled to a power supply (not shown) to provide an inductively coupled plasma.

Before a metal layer can be sputtered onto the workpiece 76, the workpiece is typically passed through a load lock (not shown) communicating with a slit valve (not shown) in the enclosure wall 84, and positioned within the chamber 74 by a robot arm, blade or other workpiece handling device (not shown) to be received on the support pedestal. In preparation for receiving a workpiece, the substrate support pedestal is lowered by a drive mechanism well below the slit valve so that the bottom of the pedestal is close to a pin positioning platform. The pedestal typically includes three or more vertical bores (not shown), each of which allows a vertically slidable pin to pass therethrough. When the pedestal is in the lowered position just described, the upper tip of each pin protrudes above the upper surface of the pedestal. The upper tips of the pins define a plane parallel to the upper surface of the pedestal.

A conventional robot arm typically carries the substrate into the chamber and places the substrate above the upper tips of the pins. A lift mechanism moves the pin platform upwardly, to place the upper tips of the pins against the underside of the substrate and additionally lift the substrate off the robot blade (not shown). The robot blade then retracts from the chamber, and the lift mechanism raises the pedestal above the tips of the pins, thereby placing the substrate onto the top surface of the pedestal. The lift mechanism continues to raise the pedestal until the substrate is an appropriate distance from the target so that the film deposition process can begin.

Sputter deposition processes are typically performed in a gas such as argon that is charged into the vacuum chamber 74 through the gas inlet 86 at a selected flow rate regulated by a mass flow controller. A power supply 92 applies a negative voltage to the target 71 with respect to the enclosure wall 84 so as to excite the gas into a plasma state. Ions from the plasma bombard the target surface 72 and sputter atoms and other particles of target material from the target 71. The power supply 92 used for biasing purposes may be any type of power supply as desired, including DC, pulsed DC, AC, RF and combinations thereof. The target is made of a sputterable material, such as copper.

Control Systems

The processes of the present invention can be implemented using a computer program product 141 that runs on a conventional computer system comprising a central processor unit (CPU) interconnected to a memory system with peripheral control components, such as for example a 68400 microprocessor, commercially available from Synenergy Microsystems, Calif. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled library routines. To execute the linked compiled object code, the system user invokes the object code, causing the computer system to load the code in memory, from which the CPU reads and executes the code to perform the tasks identified in the program.

Figure 7:
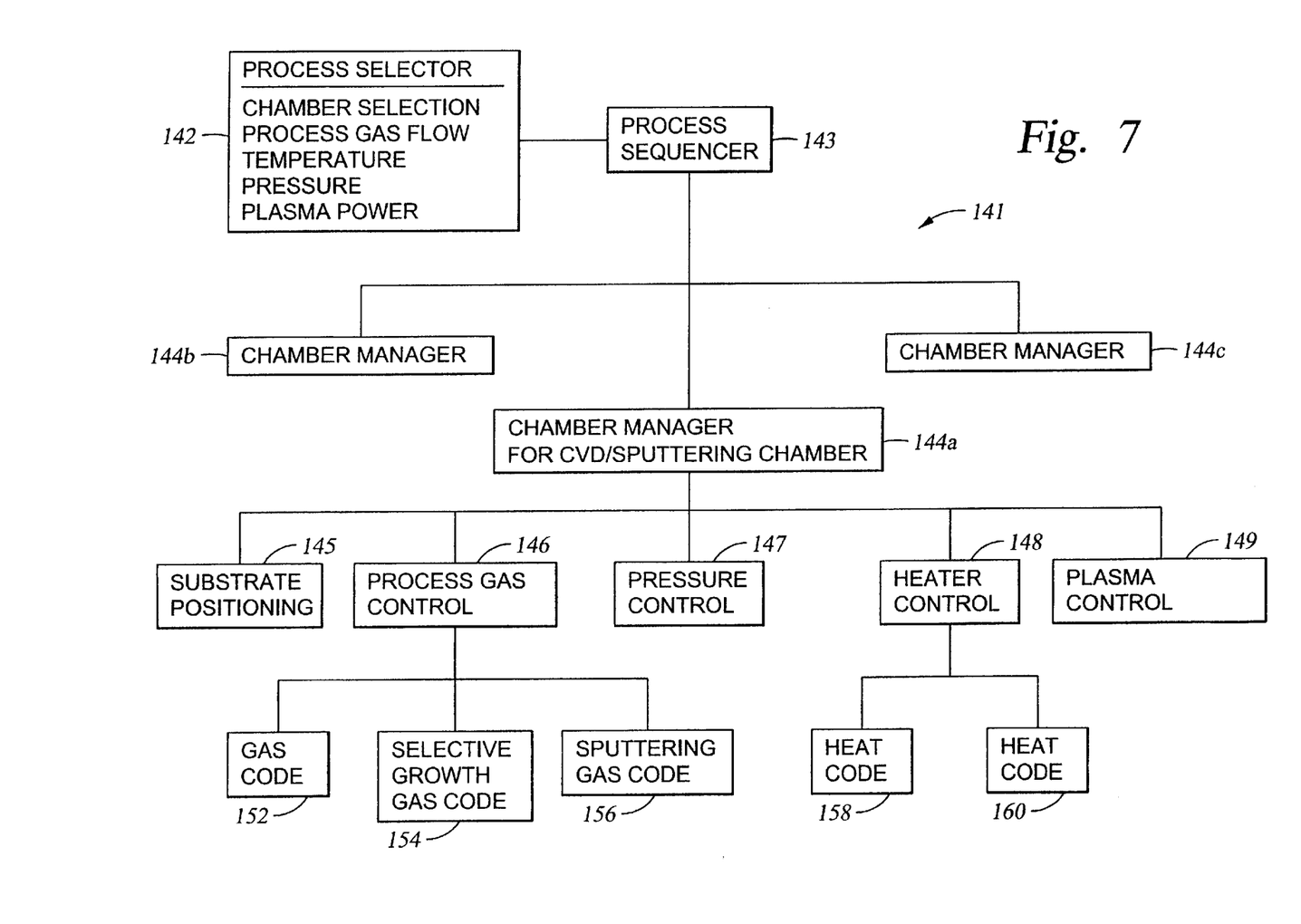
FIG. 7 is a simplified block diagram showing the hierarchical control structure of a computer program of the present invention.

FIG. 7 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process set the desired process chamber, and (ii) the desired set of process parameters needed to operate the process chamber for performing a particular process. The process parameters relate to process conditions such as, for example, process gas composition and flow rates, temperature, pressure, plasma conditions such as RF bias power levels and magnetic field power levels, cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to the chamber manager subroutines 144a–c which control multiple processing tasks in different process chambers according to the process set determined by the sequencer subroutine 143. For example, the chamber manager subroutine 144a comprises program code for controlling CVD process operations, within the described process chamber 40 and sputtering chamber 36. The chamber manager subroutine 144a also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149. These different subroutines function as seeding program code means for (i) heating the substrate to temperatures $T_s$ within a range of temperatures $\Delta T_s$, and (ii) introducing a reaction gases into the process zone to deposit a substantially continuous insulating layer on the field portions of the substrate; and deposition growth program code means for (i) maintaining the substrate at a deposition temperatures $T_d$ within a range of temperature $\Delta T_d$, and (ii) introducing deposition gas into the process zone to form an epitaxial growth layer that is grown in the contact holes or vias. Those having ordinary skill in the art would readily recognize that other chamber control subroutines can be included depending on what processes are desired to be performed in the process chamber 40.

In operation, the chamber manager subroutine 144a selectively schedules or calls the process component subroutines in accordance within the particular process set being executed. The chamber manager subroutine 144a schedules the process component subroutines similarly to how the sequencer subroutine 143 schedules which process chamber 40 and process set is to be executed next. Typically, the chamber manager subroutine 144a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described. The substrate positioning code or subroutine 145 comprises program code for controlling chamber components that are used to load the substrate onto the support 48, and optionally to lift the substrate to a desired height in the chamber 40 to control the spacing between the substrate and the gas distributor 55. When a substrate is loaded into the process chamber 40, the support 48 is lowered to receive the substrate, and thereafter, the support is raised to the desired height in the chamber. The substrate positioning subroutine 145 controls movement of the support 65 in response to the process set parameters related to the support height that are transferred from the chamber manager subroutine 144a.

The process gas control subroutine 146 has program code for controlling process gas composition and flow rates. Generally, the process gases supply lines for each of the process gases, include (i) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine 146 controls the open/close portion of the safety shut-off valves, and also ramps up/down the mass flow controllers to obtain the desired gas flow rate. The process gas control subroutine 146 is invoked by the chamber manager subroutine 144a, as are all chamber component subroutines, and receives from the chamber manager subroutine process parameters related to the desired gas flow rates. Typically, the process gas control subroutine 146 operates by opening the gas supply lines, and repeatedly (i) reading the necessary mass flow controllers, (ii) comparing the readings to the desired flow rates received from the chamber manager subroutine 144a, and (iii) adjusting the flow rates of the gas supply lines as necessary. Furthermore, the process gas control subroutine 146 includes steps for monitoring the gas flow rates for unsafe rates, and activating the safety shut-off valves when an unsafe condition is detected.

The process gas control subroutine 146 comprises deposition via program code for operating the chamber in a preferential field growth mode or a selective growth mode. In the preferential field growth stage, the reactant gas program code 152 flows reactant gas into the chamber 40 for an amount of time necessary to form a thin insulating layer on the substrate. Thereafter, in the selective deposition growth stage, the deposition gas program code 154 flows deposition gas into the chamber 40 for an amount of time necessary to grow the desired selective growth layer on the contact holes or vias and on the field. Sputtering gas program code 156 can also be provided to introduce sputtering gas into the PVD chamber 36 during performance of the PVD process step.

The process gas can be formed from a gas or liquid precursor. When a process gas is vaporized from a liquid precursor, for example dimethyl aluminum hydride (DMAH), the process gas control subroutine 146 is written to include steps for bubbling a carrier gas such as hydrogen, argon, or helium, through the liquid precursor in a bubbler assembly. For this type of process, the process gas control subroutine 146 regulates the flow of the carrier gas, the pressure in the bubbler, and the bubbler temperature in order to obtain the desired process gas flow rates. As discussed above, the desired process gas flow rates are transferred to the process gas control subroutine 146 as process parameters. Furthermore, the process gas control subroutine 146 includes steps for obtaining the necessary carrier gas flow rate, bubbler pressure, and bubbler temperature for the desired process gas flow rate by accessing a stored table containing the necessary values for a given process gas flow rate. Once the necessary values are obtained, the carrier gas flow rate, bubbler pressure and bubbler temperature are monitored, compared to the necessary values, and adjusted pressure in the chamber 40 by regulating the size of the opening of the throttle valve in the exhaust system 62 of the chamber. The opening size of the throttle valve is set to control the chamber pressure to the desired level in relation to the total process gas flow, size of the process chamber, and pumping setpoint pressure for exhaust system 62.

When the pressure control subroutine 147 is invoked, the desired or target pressure level is received as a parameter from the chamber manager subroutine 144a. The pressure control subroutine 147 operates to measure the pressure in the chamber 40 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 147 can be written to open or close the throttle valve to a particular opening size to regulate the chamber 40 at the desired pressure.

The heater control subroutine 148 comprises program code for controlling the temperature of the heater 80 used to heat the substrate. The heater control subroutine 148 includes seeding stage heating program code 158 for operating in a seeding stage in which the substrate is maintained at a desired seeding temperatures $T_s$ within the range of temperatures $\Delta T_s$. Typically, the subroutine 148 is programmed to ramp up the temperature of the support from ambient chamber temperatures to a set point temperature. When the substrate reaches the seeding temperatures $T_s$, the process gas control subroutine 146 is programmed to introduce seeding gas into the chamber, as described above. The heater control subroutine 148 also comprises epitaxial growth heating program code 160 for rapidly heating the substrate to deposition temperatures $T_d$ within a range of temperatures $\Delta T_D$ that are suitable for growing an epitaxial growth layer on the seeding layer. In this step, the heater control subroutine 148 is invoked by the chamber manager subroutine 144a and receives a ramp rate temperature parameter of at least about 50° C./min.

The heater control subroutine 148 measures temperature by measuring voltage output of a thermocouple located in the support, compares the measured temperature to the setpoint temperature, and increases or decreases current applied to the heater 80 to obtain the desired ramp rate or setpoint temperature. The temperature is obtained from the measured voltage by looking up the corresponding temperature in a stored conversion table, or by calculating the temperature using a fourth order polynomial. When radiant lamps are used as the heater 80, the heater control subroutine 148 gradually controls a ramp up/down of current applied to the lamp that increases the life and reliability of the lamp. Additionally, a built-in fail-safe mode can be included to detect process safety compliance, and to shut down operation of the heater 80 if the process chamber 40 is not properly set up.

The plasma control subroutine 149 comprises program code for forming a deposition plasma in the chamber during operation of the chamber in a chemical vapor deposition mode. The subroutine 149 sets the RF bias voltage power level applied to the process electrodes 46, 48 in the chamber 40, and optionally sets the level of the magnetic field generated in the chamber, to form the deposition plasma. Similar to the previously described chamber component subroutines, the plasma control subroutine 149 is invoked by the chamber manager subroutine 144a. In operation, the plasma condition 149 includes steps for reading both "forward" power applied to the plasma generator 64, and "reflected" power flowing through the chamber 40. An excessively high reflected power reading indicates that the plasma has not been ignited, and the plasma control subroutine 149 restarts or shuts down the process. The read power levels are compared against target levels, and the current is adjusted to control the plasma for applying a sinusoidal wave current to the generator to form a rotating magnetic field in the chamber 40. The sinusoidal wave needed to generate a desired magnetic field can be obtained from a stored table of sinusoidal values corresponding to magnetic field strengths, or calculated using a sinusoidal equation.

While the foregoing is directed to the preferred embodiment of the present invention, other and further embodiments of the invention may be devised without departing from the basic scope thereof. The scope of the invention is determined by the claims which follow.

We claim:

1. A method of forming a feature on a substrate, comprising:
    a) depositing a barrier layer over the surfaces of an aperture, the barrier layer having a thickness of between about 5 and about 700 Angstroms;
    b) chemical vapor depositing copper over the surface of the barrier layer without capping the aperture, the chemical vapor deposited copper having a thickness of between about 200 Angstroms and about 1 micron;
    c) physical vapor depositing copper over the chemical vapor deposited copper at a temperature below about 660° C. so that the physical vapor deposited copper and chemical vapor deposited copper substantially fill the aperture.

2. The method of claim 1, wherein the barrier layer has a thickness of between about 100 and about 200 Angstroms.

3. The method of claim 1, wherein the physical vapor deposition comprises the physical vapor deposition of copper at a temperature below about 400° C.

4. The method of claim 1, further comprising performing the method sequentially in an integrated processing system with a common vacuum mainframe.

5. The method of claim 1, further comprising performing the method in separate chambers.

6. The method of claim 1, wherein the barrier layer is selected from the group consisting essentially of tungsten (W), niobium (Nb), aluminum silicates, tantalum (Ta), tantalum nitride (TaN), titanium nitride (TiN), physical vapor deposition Ti/N$_2$-stuffed, TiSiN, WSiN, or a combination thereof.

7. The method of claim 1, further comprising:
    (d) exposing the substrate to oxygen between chemical vapor depositing the copper and physical vapor depositing the copper.

8. The method of claim 1, wherein the physical vapor deposited copper includes a dopant therein, the method further comprising annealing the physical vapor deposited copper at a temperature of between about 250° C. and about 450° C.

9. The method of claim 1, wherein physical vapor depositing comprises sputtering.

10. A process for filling an aperture on a substrate, comprising:
   a) forming a thin first layer over the surfaces of an aperture;
   b) forming a thin conformal chemical vapor deposited copper layer over the first layer without substantially capping the aperture; and
   c) forming a physical vapor deposited copper layer over the chemical vapor deposited copper layer, wherein the physical vapor deposited copper is deposited at a temperature less than about 660° C.

11. The process of claim 10 wherein the first layer is deposited using a physical vapor deposition process.

12. The process of claim 10 wherein the first layer has a thickness less than about 2000 Angstroms.

13. The process of claim 10 wherein the first layer comprises tantalum.

14. The process of claim 10 wherein the first layer is selected from the group consisting essentially of tungsten (W), niobium (Nb), aluminum silicates, tantalum (Ta), tantalum nitride (TaN), titanium nitride (TiN), physical vapor deposition Ti/$N_2$-stuffed, TiSiN, WSiN, or a combination thereof.

15. The process of claim 10 wherein the physical vapor deposited copper layer is deposited at a temperature less than about 400° C.

16. The process of claim 10 wherein the chemical vapor deposited copper layer is deposited at a temperature below about 400° C.

17. The process of claim 10 wherein the chemical vapor deposited copper and physical vapor deposited copper layers intermix to form an intermixed copper layer.

18. The process of claim 10, wherein forming the physical vapor deposited copper layer comprises sputtering the copper layer.

* * * * *